(12) United States Patent
Hsieh et al.

(10) Patent No.: US 6,518,137 B2
(45) Date of Patent: Feb. 11, 2003

(54) METHOD FOR FORMING STEEP SPACER IN A MOS DEVICE

(75) Inventors: Shou-Wei Hsieh, Hsin-Chu (TW); Chiu-Tsung Huang, Hsin-Chu (TW)

(73) Assignee: United Microelectronics Corp. (TW)

( * ) Notice: Subject to any disclaimer, the term of this patent is extended or adjusted under 35 U.S.C. 154(b) by 79 days.

(21) Appl. No.: 09/764,428

(22) Filed: Jan. 19, 2001

(65) Prior Publication Data

US 2002/0098659 A1 Jul. 25, 2002

(51) Int. Cl.[7] .................. H01L 21/3205; H01L 21/336

(52) U.S. Cl. ..................................................... 438/303

(58) Field of Search .................................. 438/301, 303

(56) References Cited

U.S. PATENT DOCUMENTS

| 6,090,692 A | * | 7/2000 | Song ........................... 438/303 |
| 6,150,223 A | * | 11/2000 | Chern et al. ................. 438/303 |
| 6,383,881 B1 | * | 5/2002 | Akram et al. ............... 438/302 |

* cited by examiner

Primary Examiner—Richard Elms
Assistant Examiner—Beth E. Owens

(57) ABSTRACT

Steep spacer is formed by using depositing and etching of dual conformal layers. A first conformal dielectric layer is deposited on a substrate with a gate electrode structure formed thereon. Then, a second conformal layer is deposited on the first conformal dielectric layer. The second conformal layer is anisotropically etched to form a first spacer on the sidewall of the first conformal dielectric layer. Next, the first conformal layer is anisotropically etched by using the first spacer as a mask to form a second spacer on the sidewall of the gate electrode structure. Then, the first spacer is removed and the second spacer is steep.

23 Claims, 3 Drawing Sheets

METHOD FOR FORMING STEEP SPACER IN A MOS DEVICE

BACKGROUND OF THE INVENTIONS

1. Field of the Invention

The present invention generally relates to a method for forming a spacer in a MOS (metal-oxide-semiconductor) device, and more particularly to a method for fabricating steep spacers in a MOS device.

2. Description of the Prior Art

Spacers play an important role in hot carrier immunity of the MOS device. Spacers in a MOS device are formed by anisotropically etching a conformal dielectric layer, such as TEOS (tetra-ethyl-ortho-silicate) or silicon nitride. FIG. 1 shows a standard, conventional MOS device, or MOS transistor. A substrate 100 with source/drain 110 formed therein is provided. Field isolation region 120, such as FOX (Field Oxidation), is formed on the substrate such that active area is among field isolation region 120. A gate electrode structure, including a gate dielectric layer 122 and a poly gate layer 124, is formed on the substrate 100. Spacer 130 is then formed on the sidewall of the gate electrode structure. Source/drain region 110 is then formed by ion-implantation.

In general, the shape of spacer is not steep enough. The oblique spacer 130 is easy to bridge the source/drain region 110 with gate electrode in salicide (self-aligned silicide) process. FIG. 2 is a case of showing a result of bridge between gate electrode and source/drain region 110 in a salicide process. A salicide layer 142, such as titanium salicide or cobalt salicide, is formed by depositing a metal layer, titanium or cobalt respectively, on the substrate 100 and performing a RTA (rapid thermal anneal) process. Metal layer will react will poly gate 124 and silicon on source/drain 110 to form silicide layer 142.

However, if metal layer is deposited excessively, there may be undue metal between gate and source/drain region 110 to conduct gate and source/drain region 110. This is usually occurred when spacer 130 is oblique, or the device dimension is scaled down. Therefore, this issue must be solved.

SUMMARY OF THE INVENTION

In accordance with the present invention, it is a main object of this invention to form steep spacer in a MOS device that substantially prevents S/D and gate bridging.

It is another object of this invention that steep spacer is very desirable in the salicide process as the device dimension scaled down.

In one embodiment, a method for forming a steep spacer in a metal-oxide-semiconductor device is disclosed. The method includes a first step of depositing a first conformal dielectric layer on a substrate having a gate electrode structure formed thereon. A gate electrode structure, including a gate dielectric layer and a poly gate layer. The first conformal dielectric layer may be TEOS or silicon nitride. Then, a second conformal dummy layer is deposited on the first conformal dielectric layer. During etching, the second conformal dummy layer must have different selectivity to the first conformal dielectric layer. Next, the second conformal dummy layer is anisotropically etched to form a first spacer on sidewall of the first conformal dielectric layer, and the first conformal dielectric layer is then anisotropically etched by using the first spacer as a mask to form a second spacer on sidewall of the gate electrode structure. The first spacer is removed and the second spacer is therefore steep.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Moreover, while the present invention is illustrated by a number of preferred embodiments directed to silicon semiconductor devices, and it is not intended that these illustrations be a limitation on the scope or applicability of the present invention. Further, while the illustrative examples use insulated gate control structures, and it should be recognized that the insulated gate portions may be replaced with light activated or current activated structure(s). Thus, it is not intended that the semiconductor devices of the present invention are limited to the structures illustrated. These devices are included to demonstrate the utility and application of the present invention to presently preferred embodiments.

Further, various parts of the semiconductor elements have not been drawn to scale. Certain dimensions have been exaggerated in relation to other dimensions in order to provide a clearer illustration and understanding of the present invention. Enhancement and depletion mode structures may be similarly interchanged.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth in fabricating an actual device.

The present invention substantially adds a dummy conformal layer and an etching step to form steep spacer, and this dummy layer can be a polysilicon layer, silicon nitride layer, or any other material that has a different etching selectivity to material of the steep spacer.

The main steps of this invention are disclosed below and the first step is to deposit a first conformal dielectric layer on a substrate with a gate electrode formed thereon. As key steps in this invention, a second conformal dummy layer is deposited on the first conformal dielectric layer, and the second conformal dummy layer is then anisotropically etched to form a first spacer on the sidewall of dielectric layer. Next, the first conformal dielectric layer is then anisotropically etched to form a steep spacer on the sidewall of the gate electrode by using the first spacer as a mask, and the first spacer is then removed. Suitable conditions for performing various steps set forth above are set forth below and will be explained by reference to FIG. 3 to FIG. 6.

Figure 1:
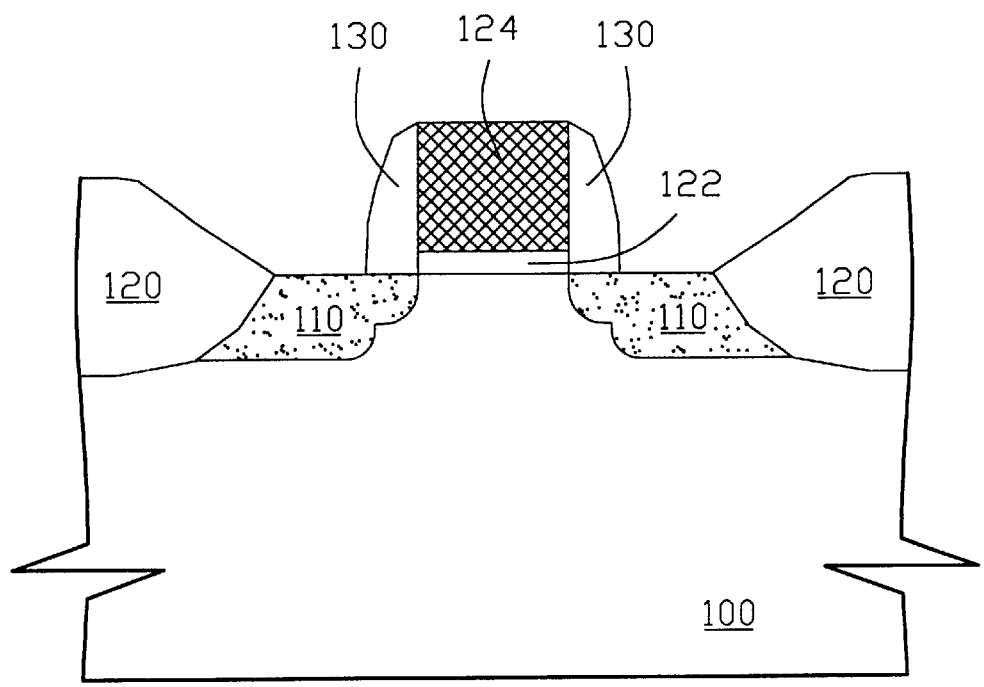
FIG. 1 shows a cross-sectional view of a substrate having a conventional MOS transistor formed therein and thereon between field isolation regions.
Figure 2:
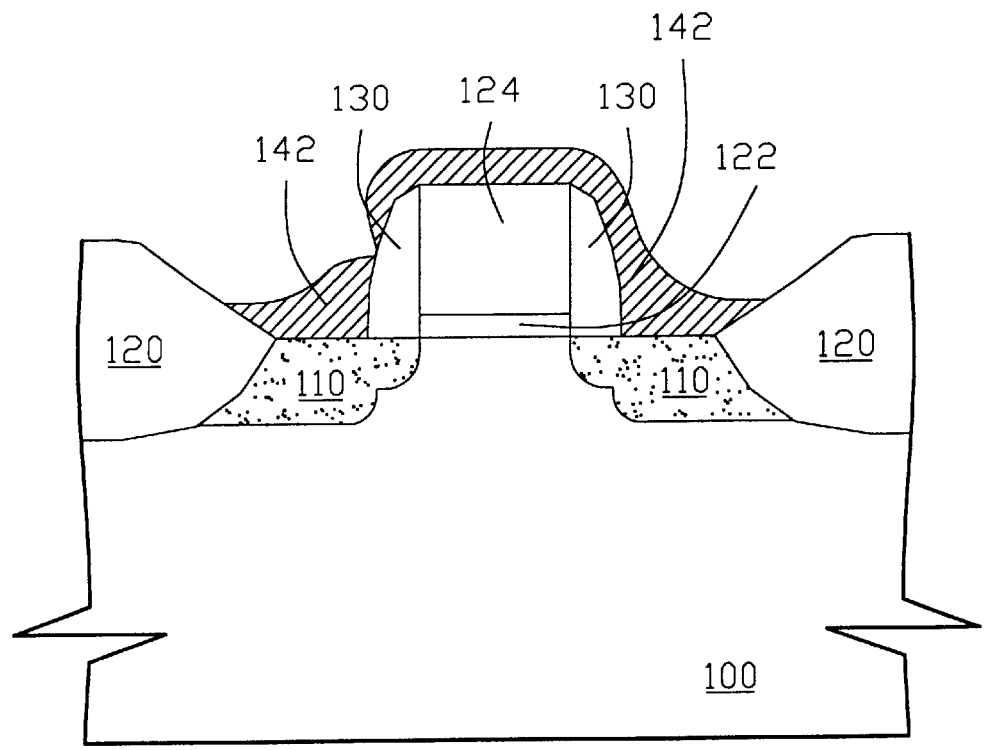
FIG. 2 shows the substrate of FIG. 1 after salicide process with the silicide layer formed thereon.
Figure 3:
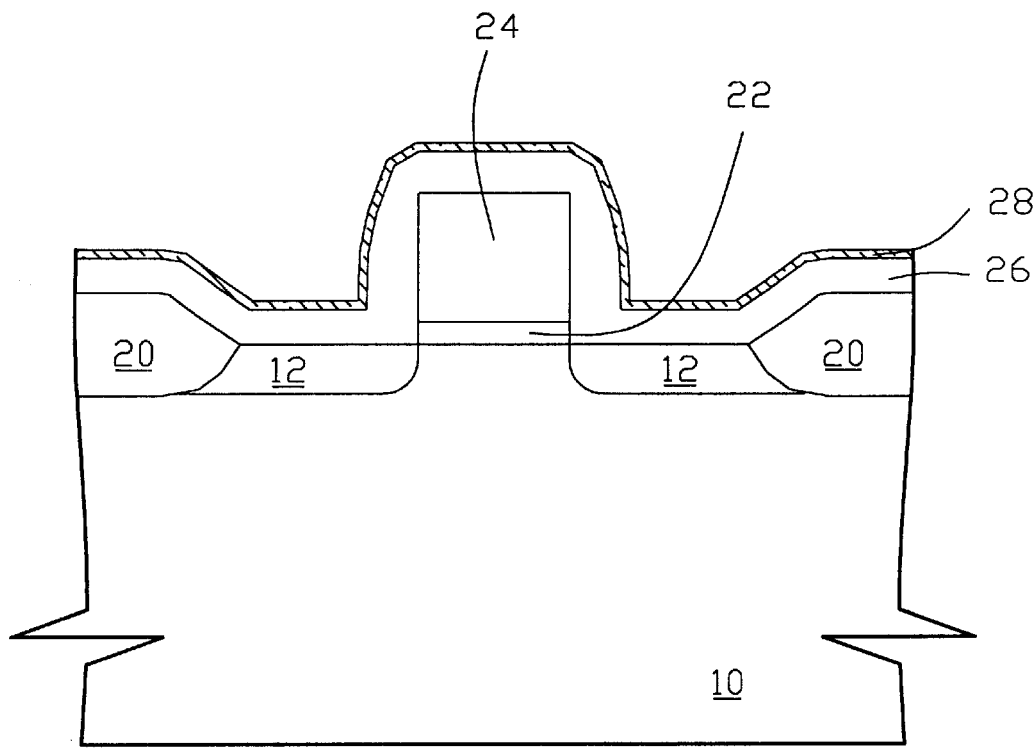
FIG. 3 shows a cross-sectional view of a substrate having two conformal layers formed on a gate electrode in accordance with a currently preferred embodiment.

Referring to FIG. 3, a substrate 10 is shown that an active area is isolated by isolation regions 20. The isolation regions 20 in this embodiment are FOX (field oxidation) formed by LOCOS (local oxidation) process, and a shallow trench isolation may also be used here. The active area includes a gate electrode, which has a polysilicon layer 24 formed on a silicon oxide layer 22, and two implanted wells 12 in the substrate 10. The two wells 12 in this embodiment are LDD (lightly-doped drain), and formed after the formation of the gate electrode by using ion-implantation process.

The following step is to deposit a conformal dielectric layer 26 of thickness between about 500 angstroms to about 3000 angstroms on the substrate 10. The layer 26 is covered the polysilicon layer 24, implanted wells 12 and isolation regions 20. Material of this dielectric layer 26 is usually TEOS formed by a conventional CVD (chemical vapor deposition) method. However, silicon nitride is another common material used for spacer, and this dielectric layer 26 is silicon nitride formed by using a LPCVD (low pressure chemical vapor deposition) method. In this embodiment, the TEOS layer is preferred as the conformal dielectric layer 26.

As a key step of this invention, a first conformal dummy layer 28 of thickness between about 100 to 200 angstroms is sequentially deposited on the dielectric layer 26. Material of this conformal dummy layer 28 must have a different etching selectivity to the dielectric layer 26. The etching speed of the dummy layer 28 is faster then the dielectric layer 26. If the dielectric layer 26 is silicon nitride, this conformal dummy layer 28 may be silicon oxide. In this embodiment, the dielectric layer 26 is TEOS, and the conformal dummy layer 28 may be silicon nitride or polysilicon. However, polysilicon is preferred, and may be formed by using any conventional LPCVD method.

Figure 4:
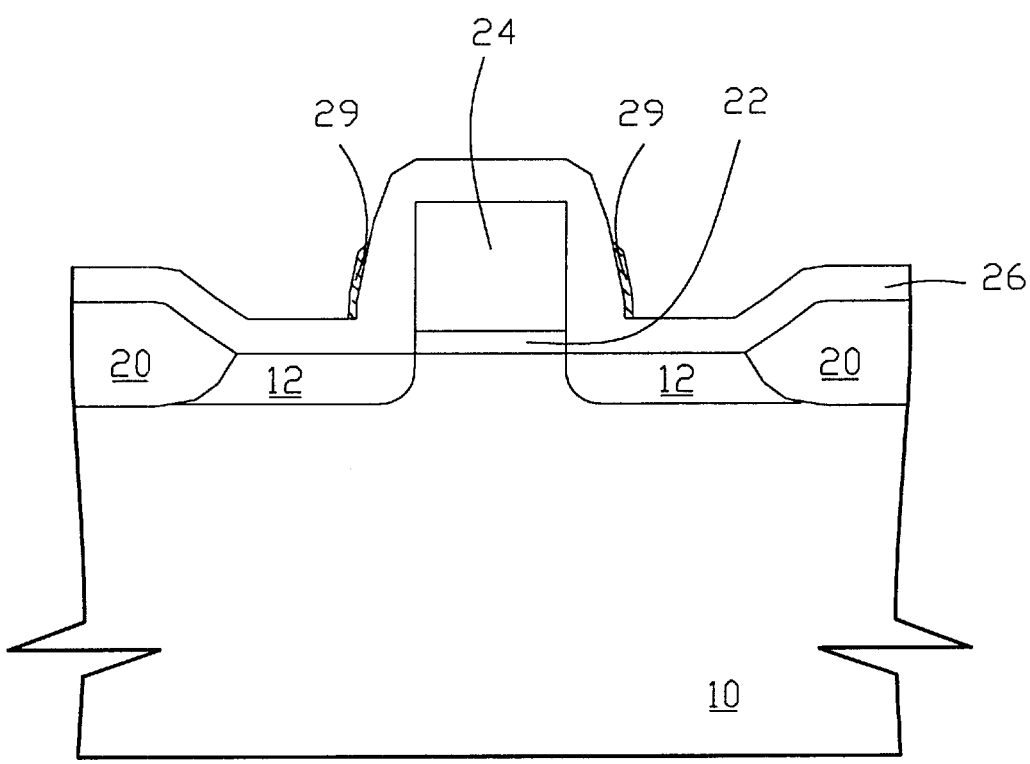
FIG. 4 shows the substrate of FIG. 3 after anisotropically etching the first conformal layer to form a first spacer in accordance with a currently preferred embodiment.

Referring to FIG. 4, as another key step of this invention, the conformal dummy layer 28 is anisotropically etched to form a first spacer 29 on the sidewall of the dielectric layer 26 adjacent to the gate electrode. Because this anisotropically etching step will etch the thickness of deposited conformal dummy layer 28, the conformal dummy layer 28 on the sidewall of dielectric layer 26 is thicker than other place, and will not increase any reaction parameter in the process, and will not be removed after etching process. In this embodiment, the anisotropically etching method is used.

Figure 5:
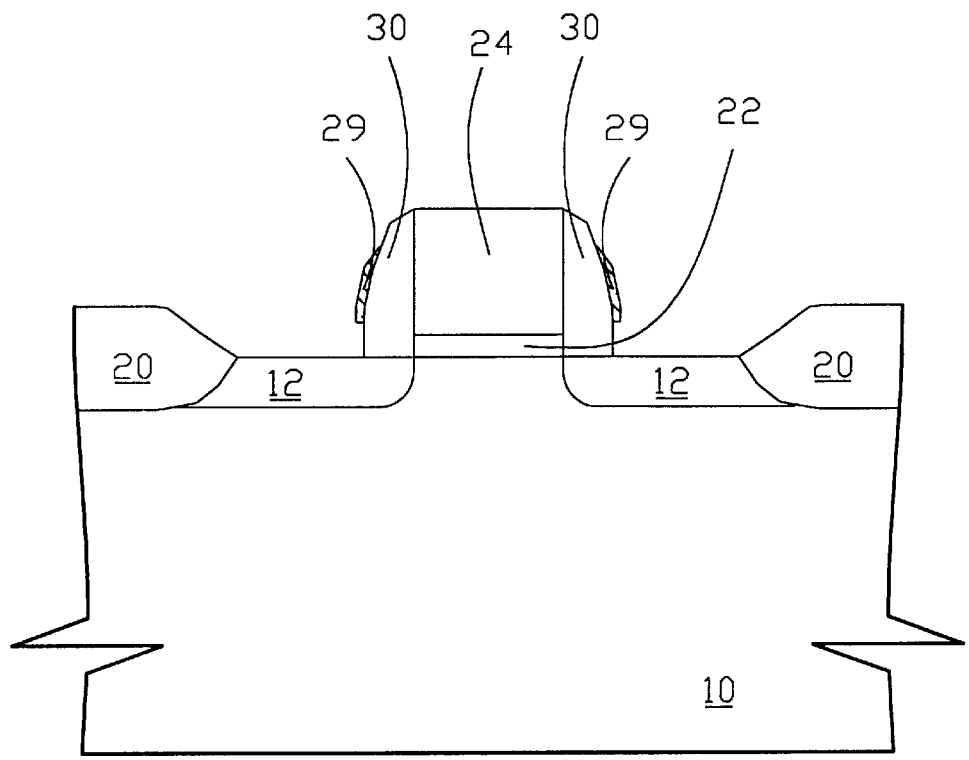
FIG. 5 shows the substrate of FIG. 4 after anisotropically etching the second conformal layer by using the first spacer as a mask to form a second spacer in accordance with a currently preferred embodiment.

Referring to FIG. 5, a steep second spacer 30 is formed by performing the second etching process, thereby the first spacer 29 as a mask can protect the second spacer 30 shape and prevent from etching a portion of the dielectric layer 26 adjacent to the sidewall of the gate electrode. In this embodiment, the anisotropically etching method is used.

Figure 6:
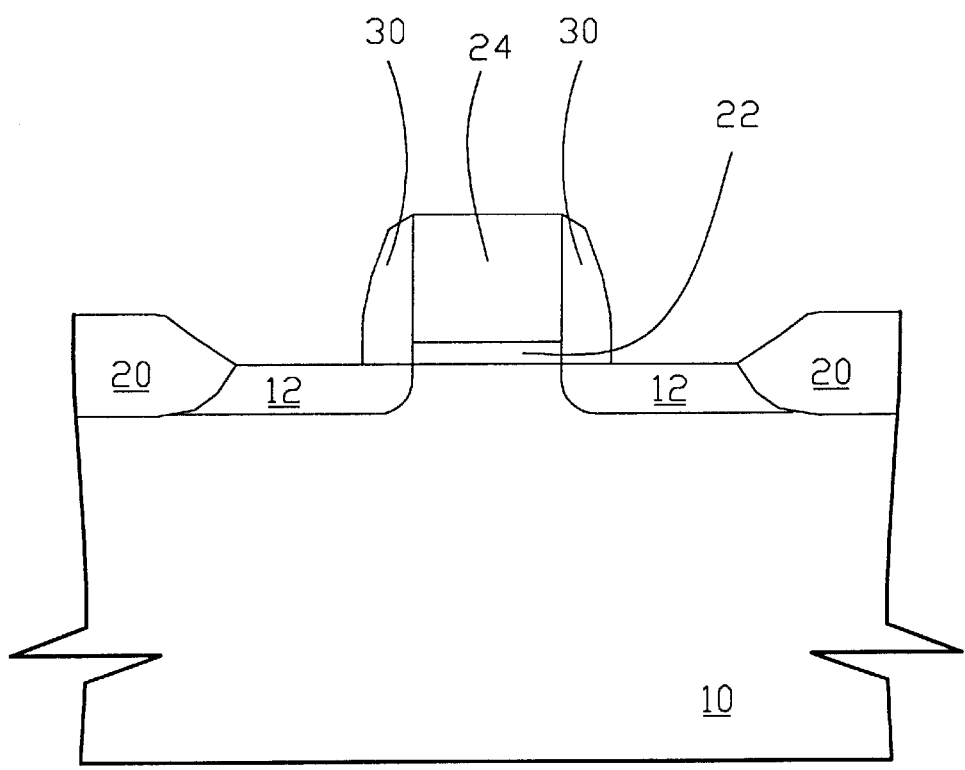
FIG. 6 shows the substrate of FIG. 5 after removing the first spacer in accordance with a currently preferred embodiment.

Referring to FIG. 6, the first spacer 29 is dipped off by the solution in the step of pre-metal cleaning. We can obtain a steep shape of the second spacer 30 after removed the first spacer 29.

The above-disclosed details of the embodiment can provide a steep spacer method. By depositing dual conformal layer and two steps etching respectively, we can obtain a steep spacer. The process only increases an additional step of conformal poly film deposition and etching to obtain a steep spacer. For next step can avoid to bridge the source and drain with gate in the salicide process, and keep off short of the source and drain with gate.

Although specific embodiments have been illustrated and described, it will be obvious to those skilled in the art that various modifications may be made without departing from what is intended to be limited solely by the appended claims.

What is claimed is:

1. A method for forming a steep spacer in a metal-oxide-semiconductor device, said method comprising:
   providing a semiconductor substrate with a gate electrode;
   depositing a dielectric layer on said gate electrode and said substrate;
   depositing a dummy layer on said dielectric layer;
   etching said dummy layer to form a first spacer on a sidewall of said dielectric layer;
   etching said dielectric layer to form a second spacer on a sidewall of said gate electrode by using said first spacer as a mask; and
   removing said first spacer.

2. The method according to claim 1, wherein said gate electrode structure comprises a silicon oxide layer and a polysilicon layer thereon.

3. The method according to claim 1, wherein said dielectric layer comprises TEOS.

4. The method according to claim 1, wherein said dielectric layer comprises silicon nitride.

5. The method according to claim 3, wherein said dielectric layer is formed by a chemical vapor deposition process.

6. The method according to claim 4, wherein said dielectric layer is formed by a low pressure chemical vapor deposition method.

7. The method according to claim 1, wherein said dummy layer comprises polysilicon.

8. The method according to claim 1, wherein said dummy layer comprises silicon nitride.

9. The method according to claim 1, wherein said dielectric layer relative to said dummy layer must have a different etching selectivity.

10. The method according to claim 7, wherein said dummy layer is deposited by a low pressure chemical vapor deposition method.

11. The method according to claim 1, wherein said method of etching said dummy layer is by anisotropic-etching.

12. The method according to claim 1, wherein said method of etching said dielectric layer is by anisotropic-etching.

13. A method for forming a steep spacer in a metal-oxide-semiconductor device, said method comprising:
   providing a semiconductor substrate with two field oxidation regions, and a gate electrode structure on said substrate;
   depositing a conformal dielectric layer on said gate electrode and said substrate;
   depositing a polysilicon layer on said conformal dielectric layer;
   etching said polysilicon layer to form a first spacer on a sidewall of said conformal dielectric layer;
   etching said conformal dielectric layer to form a second spacer on a sidewall of said gate electrode by using said first spacer as a mask; and
   removing said first spacer.

14. The method according to claim 13, wherein said gate electrode structure comprises a silicon oxide layer and a polysilicon layer thereon.

15. The method according to claim 13, wherein said conformal dielectric layer comprises TEOS.

16. The method according to claim 13, wherein said conformal dielectric layer comprises silicon nitride.

17. The method according to claim 15, wherein said conformal dielectric layer is formed by a chemical vapor deposition process.

18. The method according to claim 16, wherein said conformal dielectric layer is formed by a low pressure chemical vapor deposition method.

19. The method according to claim 13, wherein said polysilicon layer is deposited by a low pressure chemical vapor deposition method.

20. The method according to claim 13, wherein said method of etching said polysilicon layer is by anisotropic-etching.

21. The method according to claim 13, wherein said method of etching said conformal dielectric layer is by anisotropic-etching.

22. A method for forming a steep spacer in a metal-oxide-semiconductor device, said method comprising:

providing a semiconductor substrate with two field oxidation regions, and a gate electrode structure on said substrate;

depositing a silicon oxide layer on said gate electrode and said substrate;

depositing a polysilicon layer on said silicon oxide layer;

etching said polysilicon layer to form a first spacer on a sidewall of said silicon oxide layer;

etching said silicon oxide layer to form a second spacer on a sidewall of said gate electrode by using said first spacer as a mask; and removing said first spacer.

23. The method according to claim 22, wherein said gate electrode structure comprises a silicon oxide layer and a polysilicon layer thereon.

\* \* \* \* \*